United States Patent
Geha et al.

[19]

[11] Patent Number: 6,156,645
[45] Date of Patent: Dec. 5, 2000

[54] METHOD OF FORMING A METAL LAYER ON A SUBSTRATE, INCLUDING FORMATION OF WETTING LAYER AT A HIGH TEMPERATURE

[75] Inventors: Sam G. Geha, Sunnyvale; Ende Shan, Pleasanton, both of Calif.

[73] Assignee: Cypress Semiconductor Corporation, San Jose, Calif.

[21] Appl. No.: 08/740,290

[22] Filed: Oct. 25, 1996

[51] Int. Cl.⁷ .................................................. H01L 21/4763
[52] U.S. Cl. ...................... 438/648; 438/656; 438/683; 438/685
[58] Field of Search ..................... 438/648, 656, 438/683, 685

[56] References Cited

U.S. PATENT DOCUMENTS

| | | | |
|---|---|---|---|
| 4,600,658 | 7/1986 | Anderson et al. | 428/450 |
| 4,786,962 | 11/1988 | Koch | 357/71 |
| 4,970,176 | 11/1990 | Tracy et al. | 437/187 |
| 5,108,570 | 4/1992 | Wang | 204/192.3 |
| 5,236,868 | 8/1993 | Nulman | 437/190 |
| 5,242,860 | 9/1993 | Nulman et al. | 437/190 |
| 5,270,255 | 12/1993 | Wong | 437/194 |
| 5,288,665 | 2/1994 | Nulman | 437/194 |
| 5,312,512 | 5/1994 | Allman et al. | 156/636 |
| 5,371,042 | 12/1994 | Ong | 437/194 |
| 5,378,660 | 1/1995 | Ngan et al. | 437/247 |
| 5,380,678 | 1/1995 | Yu et al. | 437/190 |
| 5,393,565 | 2/1995 | Suzuki et al. | 427/255.2 |
| 5,434,044 | 7/1995 | Nulman et al. | 437/192 |
| 5,443,995 | 8/1995 | Nulman | 437/197 |
| 5,470,792 | 11/1995 | Yamada | 437/155 |
| 5,521,120 | 5/1996 | Nulman et al. | 437/190 |
| 5,804,251 | 9/1998 | Yu et al. | 427/250 |

FOREIGN PATENT DOCUMENTS

| | | | |
|---|---|---|---|
| 0 223 787 B1 | 11/1986 | European Pat. Off. | C23C 16/04 |
| 0 420 595 B1 | 4/1991 | European Pat. Off. | H01L 21/285 |
| 0 420 597 B1 | 4/1991 | European Pat. Off. | H01L 21/285 |
| 0 425 084 B1 | 5/1991 | European Pat. Off. | C23C 16/20 |
| 0 439 128 B1 | 7/1991 | European Pat. Off. | H01L 23/06 |

OTHER PUBLICATIONS

Singer, Pete, "The Interconnect Challenge: Filling Small, High Aspect Ratio Contact Holes," *Seniconductor International*, Aug. 1994, pp. 57–64.

Zheng Xu et al., Al planarization processes for multilayer metallization of quarter micrometer devices, Thin Solid Films 253 (1994), Elsevier Science S.A., pp. 367–371.

Zheng Xu et al., Planar Multilevel Metallization Technologies for ULSI Devices, SPIE, vol. 2335, pp. 70–79.

*Primary Examiner*—Richard Elms
*Assistant Examiner*—Reneé R. Berry
*Attorney, Agent, or Firm*—Long Aldridge & Norman LLP; Steven B. Kelber

[57] ABSTRACT

A wetting layer is formed on a substrate at a relatively high process temperature (e.g., the temperature of the substrate and/or the temperature within a process chamber in which the wetting layer is formed). A metallization layer that is subsequently formed on the wetting layer adheres to the wetting layer better than the metallization layer would adhere to the wetting layer if the wetting layer was formed at a lower process temperature. The high process temperature causes the density of the wetting layer to be increased, so that, consequently, the wetting layer has a smoother surface to which the metallization layer can adhere.

21 Claims, 5 Drawing Sheets

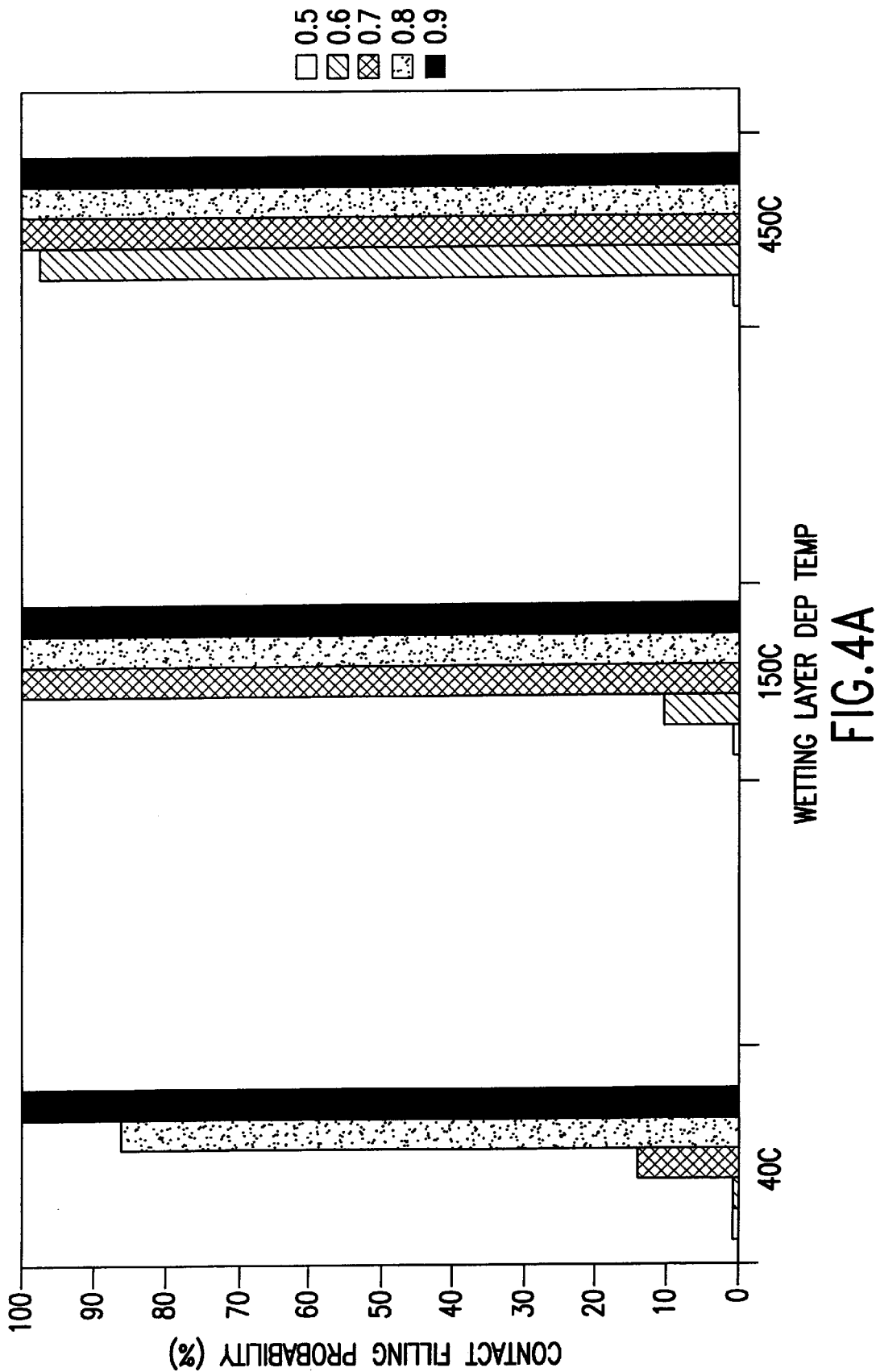

METHOD OF FORMING A METAL LAYER ON A SUBSTRATE, INCLUDING FORMATION OF WETTING LAYER AT A HIGH TEMPERATURE

BACKGROUND OF THE INVENTION

1. Field of the Invention

This invention relates to the formation of a layer of metal on a substrate and, in particular, to the formation of a wetting layer at high temperature that results in improved adhesion of a subsequently formed metallization layer to the wetting layer. Most particularly, the invention relates to the formation on a semiconductor substrate of a titanium (or titanium alloy) wetting layer at high temperature, and to the subsequent formation of an aluminum (or aluminun alloy) metallization layer on the titanium wetting layer.

2. Related Art

Formation of a layer of metal on a substrate (or on other material previously formed on the substrate) is a common step in the production of some devices, such as, for example, semiconductor devices. A metal layer can be formed as part of such a device to provide an electrically conductive trace, for example. Or, metal can be formed in a via or hole previously formed in the device to provide electrical contact between electrically conductive material (e.g., electrically conductive traces or other electrically conductive regions) formed adjacent to opposite ends of the via or hole. The formation of a metal layer can be subject to several problems, such as cusping and voiding, that may degrade the electrical performance of the metal layer. In particular, metal formed in vias having a high aspect ratio (i.e., ratio of the depth of the via to the width or diameter of the via) or over steps having a relatively large height has been subject to such problems.

In some methods of forming a layer of metal on a substrate, a wetting layer is first formed on the surface on which the metal layer is to be formed. A metal material (i.e., the "primary" metal with which it is desired to form the metal layer) is then formed on the wetting layer. The material with which the wetting layer is formed (which is, itself, often a metal material) attracts the primary metal material better than would the material of the surface on which the wetting layer is formed, so that the primary metal material more completely covers the surface on which it is desired to form the metal layer.

For example, in the production of semiconductor devices, aluminum is often formed (by, for example, deposition) on a semiconductor wafer. Before formation of the aluminum on a substrate surface, a wetting layer of a suitable material (such as titanium, titanium nitride, or a composition of titanium and tungsten) can be formed on that surface so that when the aluminum metallization layer is formed, the aluminum adheres more completely and uniformly to the substrate surface than would otherwise be the case. Previously, the wetting layer has been formed at relatively low process temperatures (e.g., while the process chamber and wafer are at a temperature less than about 200° C. and, frequently, about 40° C.) using a standard deposition process. The low temperature has been used for several reasons. First, standard heaters (such as the heater that is part of the widely used Endura sputtering system made by Applied Materials of Santa Clara, Calif.) that are used to heat the semiconductor wafer during formation of the wetting layer are not designed for extended operation at high temperatures (e.g., the recommended maximum operating temperature for the Endura heater is 450° C.). Operation of a standard heater at elevated temperatures undesirably shortens the life of the heater. Second, the wetting layer is typically formed immediately after and immediately prior to other process steps that occur at a relatively low temperature (e.g., at or below about 200° C.). For example, typically, the wetting layer is formed right after a preclean step or a sputter etch step, each of which are performed at a low temperature as described above. Further, the aluminum metallization layer (or at least an initial portion of the aluminum metallization layer) formed on the wetting layer is often formed at a low temperature. (This may be done, for example, because aluminum attaches to a wetting layer of titanium better when the aluminum is deposited at a relatively low temperature.) Thus, absent a reason to do otherwise, it is desirable to form the wetting layer at a temperature that is approximately the same as the temperature at which the prior and subsequent process steps will be performed (e.g., a temperature below about 200° C.), so that time is not unnecessarily spent heating and cooling the wafer between process steps.

Standard deposition processes have been modified to produce other processes for depositing a wetting layer on a semiconductor wafer. Collimated deposition and ionized metal plasma (IMP) deposition are two such processes.

In collimated (or "coherent") deposition, a collimator (honeycomb) is positioned in a sputtering chamber between the sputtering target and the wafer. The collimator directs the sputtered atoms of the wetting material in a direction perpendicular to the wafer, so that the likelihood that the atoms will fall to the bottom of a deep via, for example, is increased. Generally, collimated deposition produces a higher quality wetting layer—denser and smoother—than does the standard deposition process. However, because a collimator must be positioned in the sputtering chamber, the collimated deposition system is more complex and requires more frequent preventative maintenance than a standard deposition system. Additionally, the deposition rate of a collimated deposition process is slower than that for a standard deposition process (decreasing wafer throughput). These differences make collimated deposition a more expensive process than the standard deposition described above.

In IMP deposition, radiofrequency (RF) power is used to control the directionality of the sputtered atoms of the wetting material. IMP deposition can produce a wetting layer that is even more dense and smooth than that produced by collimated deposition. However, like collimated deposition, IMP deposition is somewhat more expensive than a standard deposition process. Further, IMP deposition is still being developed; commercial IMP deposition systems are not yet available. Even when such systems are available, the high cost of replacing existing standard deposition systems with IMP deposition systems will represent a significant deterrent to the use of IMP deposition systems.

In another previous process for forming a metal layer on a semiconductor wafer, tungsten (actually, a combination of tungsten and fluorine, $WF_6$) is formed (e.g., deposited) as the primary metal material (i.e., as the metallization layer). Tungsten is sometimes used instead of aluminum as a metallization layer on a semiconductor wafer because, for example, tungsten can more easily fill in high aspect ratio vias. In a tungsten metallization process, titanium is first formed on the surface (which is typically silicon) on which the metal layer is to be formed. The titanium does not function as a wetting layer, but is formed, instead, because it provides better contact resistance with silicon than does tungsten. However, since titanium reacts with the fluorine that is combined with the tungsten, a barrier layer (typically made of titanium nitride, though other materials could be used) must be formed over the titanium. The tungsten ($WF_6$) is then formed over the barrier layer. In a previous tungsten metallization process, titanium nitride has been deposited as a barrier layer while the process chamber and wafer are held at a relatively elevated temperature (e.g., the wafer can be at a temperature of about 375° C.). The elevated temperature has been used to reduce film stress during deposition of the titanium nitride. In such a tungsten metallization process, the titanium (which has typically been deposited using a collimated deposition process) has been deposited at approximately the same temperature as that used for deposition of the titanium nitride. This is done not for any reason associated with the titanium deposition, but, rather, occurs incidentally so that there is no need to heat the wafer between the titanium deposition and the subsequent titanium nitride deposition.

It is desirable to provide a method of forming a metal layer on a substrate that improves upon the capability of the above-described methods to produce a high quality metal layer, e.g., a metal layer having few or no voids. In particular, it is desirable to provide a method of forming a wetting layer for use in forming a metal layer that enhances the capability to produce such a high quality metal layer and that facilitates the implementation of the process steps necessary to produce a metal layer (e.g., enlarges the process window for those steps).

SUMMARY OF THE INVENTION

According to the invention, a wetting layer is formed on a substrate at a relatively high process temperature (e.g., the temperature of the substrate and/or the average temperature within a process chamber in which the wetting layer is formed). A metallization layer that is subsequently formed on the wetting layer adheres to the wetting layer better than the metallization layer would adhere if the wetting layers had been formed at a lower process temperature. The high process temperature causes the density of the wetting layer to be increased, so that, (consequently, the wetting layer has a smoother surface to which the metallization layer can adhere.

In one embodiment of the invention, a method of forming a layer of metal on a substrate while the substrate is positioned in a process chamber comprises the steps of: i) forming a wetting layer on a first substrate surface while the process chamber temperature is greater than or equal to about 250° C.; and ii) forming a metallization layer on the wetting layer. The method is more preferably performed by heating the process chamber to a temperature greater than or equal to about 275° C., even more preferably to a temperature greater than or equal to about 400° C., and most preferably to a temperature greater than or equal to about 450° C. The method can advantageously be used in forming a wetting layer of titanium. In particular, the method can advantageously be used in forming a wetting layer of titanium on which a metallization layer of aluminum is then formed. The method can be used with any method for forming a metallization layer, even a method in which, immediately subsequent to the formation of the wetting layer, some or all of the metallization layer is formed with the process chamber at a temperature that is lower than the process chamber temperature during the formation of the wetting layer, in contrast to the above-discussed method for depositing a titanium wetting layer followed by an aluminum metallization layer.

In another embodiment of the invention, a method of forming a layer of metal on a substrate while the substrate is positioned in a process chamber comprises the steps of: i) forming a wetting layer on a first substrate surface while the process chamber temperature is greater than or equal to a predetermined temperature; and ii) forming at least a portion of a metallization layer on the wetting layer while the process chamber temperature is less than or equal to the predetermined temperature. In a particular embodiment, the predetermined temperature is about 250° C. In another particular embodiment, the predetermined temperature is about 400° C. In a still further embodiment based on this latter embodiment, at least a portion of the metallization layer is formed while the process chamber temperature is less than or equal to about 250° C.

In yet another embodiment of the invention, a method for use in forming a layer of metal on a substrate, the steps of the method being performed in a process chamber, comprises the steps of: i) heating the process chamber; and ii) forming a wetting layer on a substrate surface while the process chamber temperature is greater than or equal to about 250° C. The method is more preferably performed by heating the process chamber to a temperature greater than or equal to about 275° C., even more preferably to a temperature greater than or equal to about 400° C., and most preferably to a temperature greater than or equal to about 450° C. The method can advantageously be used in forming a wetting layer of titanium.

As discussed above, forming a wetting layer in accordance with the invention enables a metallization layer to be formed more smoothly on the wetting layer, improving the quality of the overall metal layer so formed. The improved wetting layer according to the invention can thus enlarge the process window for the formation of the metallization layer. For example, the process temperature (e.g., the substrate temperature) during a hot deposition step of a two-step aluminum deposition process can be reduced while still producing a metal layer of the same quality. This is particularly advantageous, since reduction in the substrate temperature reduces the likelihood that the substrate temperature will become high enough to cause damage to the substrate (e.g., previously deposited metal layers on the substrate). Alternatively, if the other aspects of the process of forming a metal layer are left unchanged, a wetting layer formed in accordance with the invention improves the quality of the overall metal layers formed using the wetting layer, thus enabling formation of more difficult metal layers (e.g., high aspect ratio vias). Consequently, it is possible to use aluminum deposition for situations in which it previously would have been necessary to use tungsten deposition, thereby enabling the elimination of process steps and, consequently, producing significant savings in cost and time in producing a metal layer in these situations.

Further, using a relatively high process temperature in accordance with the invention enables formation of a wetting layer using a standard deposition process that equals or approaches the quality of a wetting layer produced using collimated or IMP deposition. Thus, a high quality wetting layer can be produced without need to modify or replace existing deposition processes and equipment. Moreover, even collimated and IMP deposition processes can be improved by increasing the process temperature in accordance with the invention.

BRIEF DESCRIPTION OF THE DRAWINGS

FIGS. 4A and 4B are bar charts illustrating the improved quality of aluminum contacts formed on a titanium wetting layer as the temperature at which the titanium wetting layer is formed is increased.

DETAILED DESCRIPTION OF THE INVENTION

Figure 1:
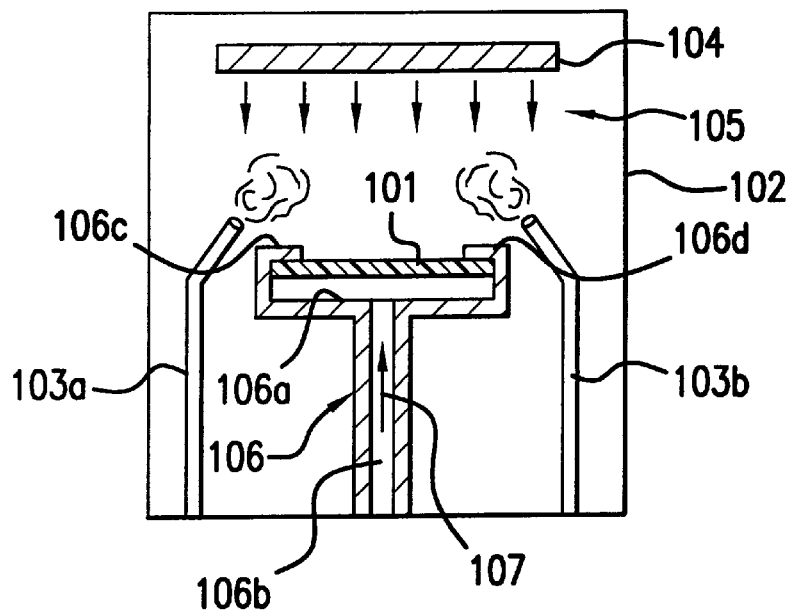
FIG. 1 is a simplified cross-sectional view of an apparatus with which the invention can be implemented.

FIG. 1 is a simplified cross-sectional view of an apparatus with which the invention can be implemented. As shown in FIG. 1, the apparatus is a conventional sputtering chamber. However, generally, the apparatus can be any apparatus that is configured to enable a metal to be formed (e.g., deposited) on a surface of a substrate. For example, the invention could also be implemented using an apparatus for forming a metal layer by chemical vapor deposition.

In FIG. 1, a substrate 101 (e.g., a semiconductor wafer) is positioned within a process chamber 102. As is well known to those skilled in the art of sputtering, the process chamber 102 is held at a vacuum pressure and a sputtering gas is injected into the process chamber 102 through one or more gas inlets (two gas inlets 103a and 103b are shown in FIG. 1), the gas is ionized, and the ions are accelerated toward a sputtering target 104. A metal to be deposited on a surface of the substrate 101 (the upper surface, as shown in FIG. 1) is formed on the sputtering target 104 so that when the sputtering gas ions strike the sputtering target 104, atoms of the metal (shown generally by the arrows designated by the numeral 105) are dislodged from the sputtering target 104. Some of the dislodged metal atoms are deposited on the upper surface of the substrate 101, thus forming a metal layer on the substrate 101.

Initially, the substrate 101 may be supported on a substrate support surface 106a of a substrate support 106. A heated gas (shown generally by the arrow designated by the numeral 107) can be flowed through a channel 106b formed in the substrate support 106 to impact a surface (the bottom surface, as shown in FIG. 1) of the substrate 101, forcing the substrate 101 away from the substrate support surface 106a and against substrate retention arms 106c and 106d, where the substrate 101 is held in place while metal is deposited on the upper substrate surface (this position is shown in FIG. 1). The temperature of the heated gas 107 is controlled so that the gas 107 heats the substrate 101 to a desired temperature during deposition of the metal. Though FIG. 1 shows a single heating gas inlet (channel 106b), it is to be understood that the heating gas can be supplied through any number of heating gas inlets, that the heating gas inlets can be positioned at any location proximate to the substrate bottom surface, and that the heating gas inlets can be configured to impinge the heating gas against the substrate 101 at any angle.

In another embodiment of the invention, a sputtering chamber such as that shown in FIG. 1 can be used without heating the substrate with a heated gas as described immediately above. In such an embodiment, the Substrate 101 remains on the substrate support surface 106a of the substrate support 106 while the metal is deposited on the upper substrate surface. Typically, the process chamber 102 (and, in many cases, the substrate 101) is heated up as a consequence of injection of the sputtering gas—which is typically heated—into the process chamber 102.

The invention can be implemented, for example, using an Endura sputtering system made by Applied Materials of Santa Clara, Calif. The Endura sputtering system can include one to four sputtering chambers as described generally above with respect to FIG. 1. Below, exemplary magnitudes are given for certain aspects of the invention: in particular, process chamber temperatures, heating gas temperatures and substrate temperatures. These magnitudes relate particularly to implementation of the invention using an Endura sputtering system. However, the magnitudes (both absolute and relative) are expected to be similar for other sputtering systems.

Figure 2:
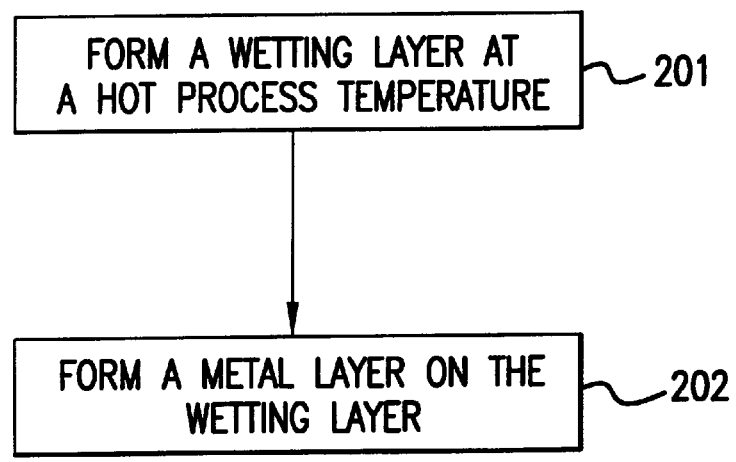
FIG. 2 is a flow chart of a method, according to an embodiment of the invention, for forming a metal layer on a substrate.

FIG. 2 is a flow chart of a method 200, according to an embodiment of the invention, for forming a metal layer on a substrate. As used herein, "metal layer" refers generally to any formation of a metal on a substrate, without regard to the relative magnitudes of the dimensions of the metal formation (i.e., the term "metal layer" is not intended to be restricted by the connotation associated with the word "layer"). For example, in a semiconductor device, a metal layer can include, for example, an electrically conductive trace formed of metal, an electrically conductive ground or power plane formed of metal, or an electrically conductive contact (i.e., a filled via) formed of metal.

In step 201 of the method 200, a wetting layer is formed on the substrate at a hot process temperature. Herein, a "wetting layer" is any layer of material which causes a subsequently formed metallization layer to adhere to the substrate better than would be the case if the metallization layer were formed directly on the substrate. Typically, the wetting layer is relatively thin, e.g., 100 to 300 angstroms. Thus, the wetting material is typically formed (e.g., deposited) for a relatively short period of time, only long enough to ensure that the wetting material covers all surfaces that are desired to be covered. "Process temperature" refers generally to the temperature at which a process occurs and can refer to, for example, the temperature of the substrate ("substrate temperature") and/or the average temperature within a process chamber ("process chamber temperature") in which the process takes place. Generally, a "hot process temperature" at which a wetting layer is formed is any process temperature higher than the process temperature at which such a wetting layer has previously been formed. What can constitute a "hot process temperature" is discussed in more detail below. To obtain an improved wetting layer in accordance with the invention, the wetting material can be deposited at any time after the process temperature has increased above the process temperature used in previous such processes for forming a wetting layer. In particular, the process temperature need not have risen to a steady state temperature; the wetting layer can be formed while the process temperature is increasing, through generally the highest quality wetting layer is achieved by forming the entire wetting layer after the process temperature has reached a predetermined hot process temperature.

In step 202, a metallization layer is formed on the wetting layer. Herein, a "metallization layer" is a layer of metal which is the primary layer that it is desired to form on the substrate. Generally, the metallization layer can be formed using any appropriate process (some examples are discussed below). Both the wetting layer and the metallization layer can be formed in a sputtering chamber as described above with respect to FIG. 1. Typically, the wetting layer and metallization layer are formed in different sputtering chambers, though this need not necessarily be the case.

Forming a wetting layer at a hot process temperature in accordance with the invention produces a wetting layer that is denser than would be the case at a process temperature below the hot process temperature. It is believed that the elevated process temperature increases the mobility of the atoms of the material with which the wetting layer is formed; consequently, the atoms disperse more completely over the surface of the substrate, filling in any available spaces more completely to form a more compact wetting layer than is formed at lower process temperatures. Since the wetting layer is denser, the wetting layer has a smoother surface to which the subsequently formed metallization layer can adhere. Thus, the metallization layer is more likely to be formed smoothly and continuously, without voids, at the junction with the wetting layer. Such smooth and continuous formation of the deposited metal increases the likelihood that subsequently deposited metal will be formed smoothly and continously. Thus, the probability of forming a void-free metal layer is increased. Additionally, a wetting layer formed in accordance with the invention has improved barrier properties as compared to previous wetting layers formed at lower process temperatures. Generally, the principles of the invention are applicable to the formation of a wetting layer and metallization layer of any appropriate material or materials, i.e., increasing the process temperature before and/or during formation of a wetting layer to a higher level than previously used when forming such a wetting layer produces a wetting layer to which the subsequently formed metallization layer adheres better than has previously been the case when such a wetting layer has been used.

Varying other process parameters may also affect the quality of the wetting layer produced. For example, decreasing the chamber pressure may produce a denser wetting layer. As the chamber pressure is decreased, then, this effect tends to decrease the process temperature necessary to produce a wetting layer of a given density. On the other hand, decreasing the chamber pressure causes the heating of the substrate to be less efficient. As the chamber pressure is decreased, this effect tends to increase the process temperature necessary to produce a wetting layer of a given density. Generally, the effect of variation in other process parameters within the range of acceptable values of the process parameters is not believed to significantly affect the magnitude of the process temperature necessary to produce the benefits of the invention.

Figure 3A:
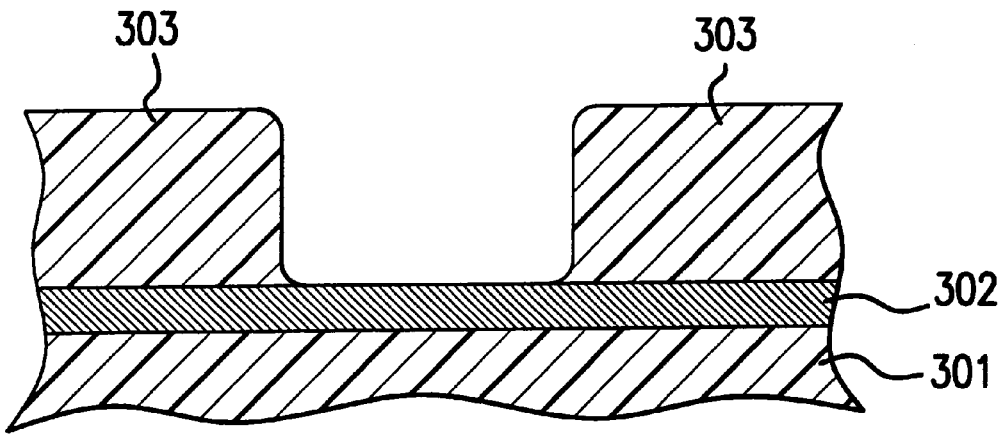
FIGS. 3A and 3B are cross-sectional views of a structure before and after, respectively, formation of a metal layer on the structure according to a method of the invention.
Figure 3B:
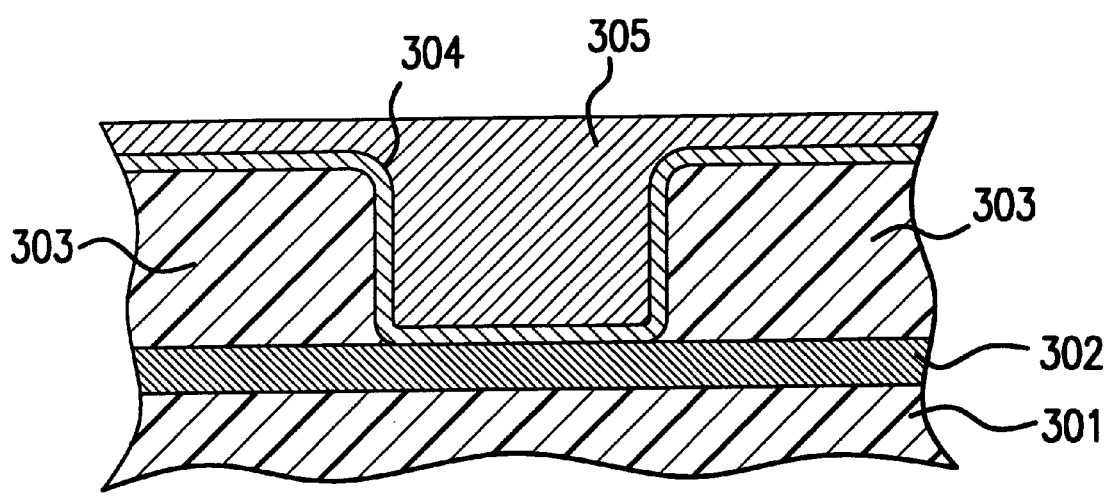

FIG. 3A is a cross-sectional view of a structure on which a metal layer can be formed according to a method of the invention. FIG. 3B is a cross-sectional view of the structure of FIG. 3A after a metal layer has been formed on the structure according to a method of the invention. The structure shown in FIG. 3B can be, for example, a portion of a semiconductor substrate (e.g., a semiconductor wafer) in which a conductive via makes electrical connection between two electrically conductive regions (e.g., electrically conductive traces).

In FIG. 3A, an electrically conductive layer 302 is formed on a first dielectric layer 301. A second dielectric layer 303 is formed on the electrically conductive layer 302. A via is formed in the second dielectric layer 303 to expose a portion of the electrically conductive layer 302.

As shown in FIG. 3B, a wetting layer 304 has been formed on the structure of FIG. 3A. The wetting layer 304 is formed in accordance with a method of the invention (e.g., by the step 201 of the method 200). The wetting layer 304 covers the exposed portion of the electrically conductive layer 302, the surface or surfaces of the second dielectric layer 303 that form the walls of the via, and the surface of the second dielectric layer 303 adjacent to the via. A metallization layer 305 has been formed on the wetting layer 304. The metallization layer 305 can be formed by any appropriate method. The metallization layer 305 fills in the via and covers the wetting layer 304 adjacent to the via. Together, the wetting layer 304 and metallization layer 305 are a metal layer formed in accordance with the invention.

The invention can be used to form a metal layer on a semiconductor substrate (e.g., a semiconductor wafer). Electrical connection between electrically conductive regions of material on a semiconductor substrate is often made by forming a layer of metal (e.g., by forming an electrically conductive trace or via) on the substrate to connect the electrically conductive regions. Such metal layers are commonly formed by depositing aluminum (or an aluminum alloy) on the substrate. In some situations, the aluminum may not adhere as well as desired to the surface (e.g., silicon) on which it is desired to deposit the aluminum. As discussed above, a wetting layer can first be formed on the surface so that when the aluminum is formed, the aluminum adheres more completely and uniformly to the wetting layer than the aluminum would adhere to the substrate surface. Titanium can be used, for example, to form the wetting layer. Titanium nitride or a composition of titanium and tungsten could also be used to form the wetting layer. Even aluminum might be used to form the wetting layer. Previously, for the reasons discussed above, a relatively low process temperature (e.g., less than about 200° C. and, frequently, about 40° C.) has been used when a wetting layer of titanium is deposited prior to deposition of a metallization layer of aluminum.

According to the invention, a higher process temperature is used when forming a wetting layer than has previously been used. In one embodiment of the invention, the substrate is heated to a hotter temperature during the formation of the wetting layer than has previously been used in the formation of such a wetting layer. In a particular embodiment of the invention, the substrate is heated so that the substrate is at a temperature of greater than or equal to about 225° C. during formation of the wetting layer. In a further particular embodiment, the substrate is heated so that the substrate is at a temperature of greater than or equal to about 250° C. during formation of the wetting layer. In yet a further particular embodiment, the substrate is heated so that the substrate is at a temperature of greater than or equal to about 350° C. during formation of the wetting layer. In a still further particular embodiment, the substrate is heated so that the substrate is at a temperature of greater than or equal to about 400° C. during formation of the wetting layer. The substrate can be heated to these temperatures in any appropriate manner. For example, the substrate can be heated directly by, for example, impinging a heated gas on the substrate (such as described above with respect to FIG. 1). Or, the substrate can be heated indirectly as a consequence, for example, of the heating of the process chamber as a result of the introduction of a sputtering gas into the process chamber. Or, the substrate can be heated by a combination of these mechanisms.

In another embodiment of the invention, the process chamber is heated to a hotter temperature during the formation of the wetting layer than has previously been used in the formation of such a wetting layer. In a particular embodiment of the invention, the process chamber is heated so that the process chamber is at a temperature of greater than or equal to about 250° C. during formation of the wetting layer. In a further particular embodiment, the process chamber is heated so that the process chamber is at a temperature of greater than or equal to about 275° C. during formation of the wetting layer. In yet a further particular embodiment, the process chamber is heated so that the process chamber is at a temperature of greater than or equal to about 400° C. during formation of the wetting layer. In a still further particular embodiment, the process chamber is heated so that the process chamber is at a temperature of greater than or equal to about 450° C. during formation of the wetting layer. As with the heating of the substrate, the process chamber can be heated to these temperatures in any appropriate manner. For example, the process chamber may be heated as a result of the introduction of a heated sputtering gas into the process chamber, as a result of the heating of the substrate (e.g., by impinging a heating gas against the substrate), or as a result of the combination of these two.

In still another embodiment of the invention, the temperature of a heating gas used to heat a substrate (e.g., as described above with respect to FIG. 1) during formation of a wetting layer is greater than or equal to about 250° C., more preferably greater than or equal to about 275° C., even more preferably greater than or equal to about 400° C. and most preferably greater than or equal to about 450° C.

The substrate, process chamber and heating gas temperatures given immediately above for particular embodiments of the invention are appropriate, in particular, when the wetting layer is formed of titanium (i.e., titanium that is essentially pure except for the presence of incidental contaminants). However, these temperatures are also appropriate, with little or no change, for use with wetting materials that are a composition of titanium and some other material, such as titanium nitride or a composition of titanium and tungsten.

The density of the wetting layer increases as the magnitude of the process temperature during formation of the wetting layer increases; therefore, generally, the process temperature is made as high as possible. However, the magnitude of the substrate temperature is limited by the fact that high substrate temperatures increase the likelihood of damaging the substrate (e.g., damaging previously deposited metal layers on the substrate by, for example, forming voids as a result of thermal stress). In view of this consideration, the substrate temperature is preferably maintained less than or equal to about 500° C. when the material being used for the metallization layer is aluminum. When previous layers of aluminum have already been formed on the substrate, the maximum substrate temperature is preferably kept even lower, e.g., less than or equal to about 430° C. If the metallization layer is formed of tungsten, then these maximum temperatures can be somewhat higher.

In a system such as shown in FIG. 1 in which the substrate 101 is heated by flowing the heated gas 107 against the bottom surface of the substrate 101, the gas 107 (and, therefore, the process chamber 102) is heated to a temperature that is somewhat greater than the temperature of the substrate 101. The particular temperature to which the gas 107 must be heated to produce a particular substrate temperature can depend upon the sputtering system used (in particular, the heating apparatus of the sputtering system), the length of time that the substrate 101 is heated, and other process parameters (e.g., chamber pressure). Additionally, the temperature difference typically becomes greater as the substrate temperature increases. For example, the temperature of the substrate 101 is generally about 50° C. to 75° C. less than the temperature of the heated gas 107 (at substrate temperatures above 250° C.) in an embodiment of the invention in which the Endura sputtering system is used to form the wetting layer, the chamber pressure is about 2 mTorr, the sputtering gas 105 is argon that is flowed into the process chamber 102 at a flow rate of about 25 sccm, and the heated gas 107 is argon that is flowed against the bottom surface of the substrate 101 at a flow rate of about 15 sccm. In particular, for a heating gas temperature of about 40° C., the wafer temperature is about 30° C.; for a heating gas temperature of about 150° C., the wafer temperature is about 130° C.; and for a heating gas temperature of about 450° C., the wafer temperature is about 390° C.

The invention has particular utility when used in a metallization process in which a titanium wetting layer is formed prior to forming an aluminum metallization layer on the titanium wetting layer. As discussed above, in such metallization processes, aluminum that is formed immediately after formation of the wetting layer is often formed at a relatively cold process temperature (e.g., when the substrate temperature is below about 200° C.). For example, in some previous methods of forming an aluminum metallization layer on a semiconductor substrate, the aluminum layer is formed using a two step process. Several such methods are described in the commonly owned, copending U.S. patent application Ser. No. 08/693,978, entitled "Improved Hot Metallization Process," by Sam G. Geha, filed Aug. 1, 1996, the disclosure of which is incorporated by reference herein. In a first step (the "cold" deposition step), a first portion of aluminum is deposited at a relatively cold process temperature as described above. In the second step (the "hot" deposition step), a second portion of aluminum is deposited on the first portion of aluminum at a relatively hot process temperature (e.g., while the substrate is at a temperature of about 450° C. to about 500° C.). In previous such metallization processes, if a titanium wetting layer is to be formed, the titanium wetting layer is formed at a relatively low process temperature that approximates the process temperature to be used during the cold deposition step, so that time need not be spent heating up or cooling down the substrate between the titanium deposition and the cold aluminum deposition. In contrast, according to the invention, during formation of a titanium wetting layer, a process temperature is used which is significantly above that at which a cold aluminum deposition is typically performed. The improvement in the quality of the wetting layer so produced outweighs any detriment resulting from the need to cool the substrate after forming the wetting layer.

While the invention is known to be particularly useful, as described above, when used to form a wetting layer prior to forming aluminum at a lower process temperature than that at which the wetting layer was formed, the invention can also be used when aluminum is subsequently formed at a higher process temperature than that at which the wetting layer was formed.

Figure 4B:
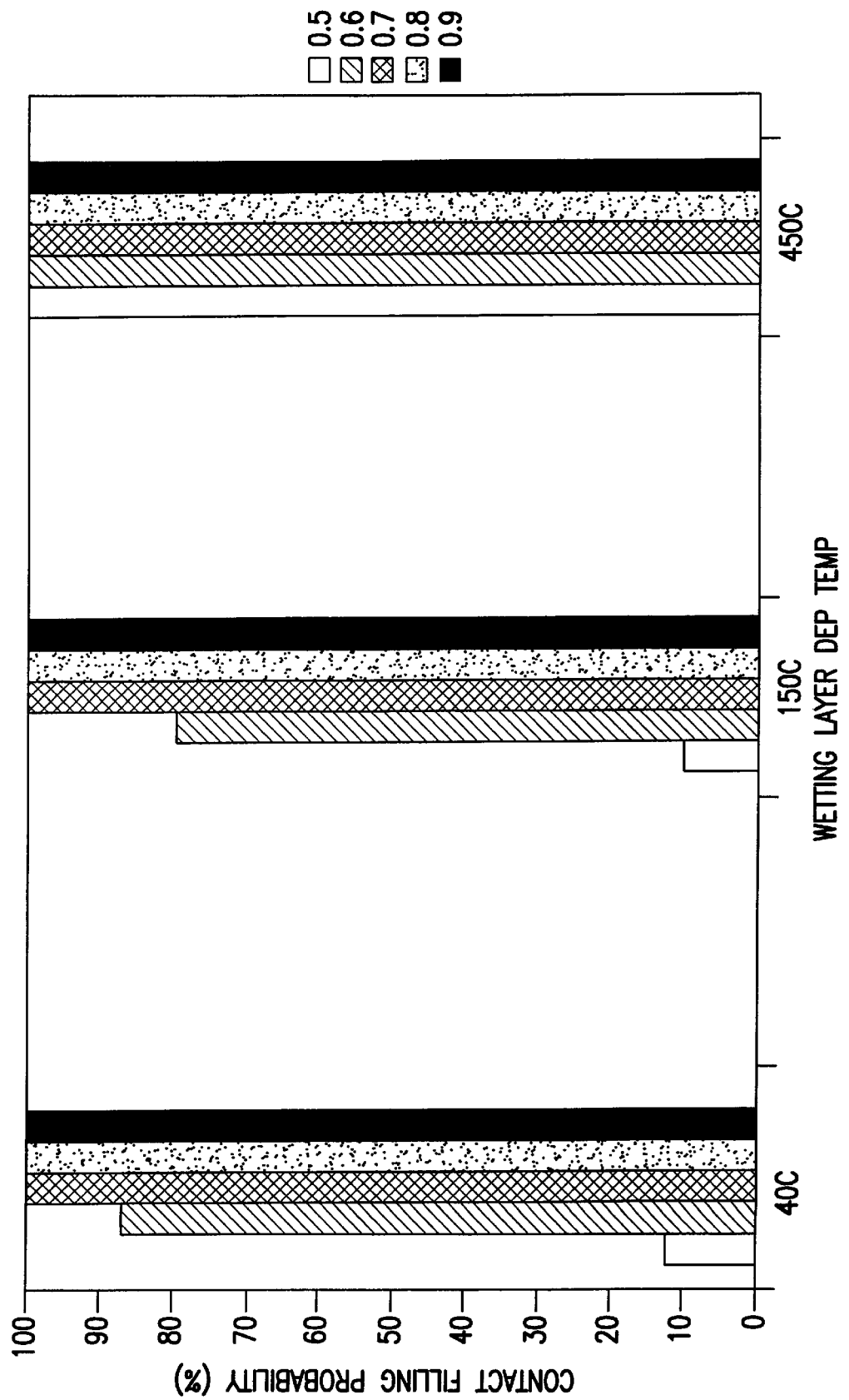

FIGS. 4A and 4B are bar charts illustrating the improved quality of aluminum contacts formed on a titanium wetting layer as the process temperature at which the titanium wetting layer is formed is increased. The results shown in FIGS. 4A and 4B were obtained using an Endura sputtering system to deposit both the titanium wetting layer and the aluminum metallization layer. During deposition of the titanium wetting layer, the chamber pressure was about 2 mTorr, an argon sputtering gas was flowed into the process chamber at a flow rate of about 25 sccm, and an argon heating gas was flowed against the bottom surface of the wafer at a flow rate of about 15 sccm. The power applied to the magnetron of the Endura sputtering system was about 750 watts DC. During deposition of the aluminum layer, the chamber pressure was about 6 mTorr, an argon sputtering gas was flowed into the process chamber at a flow rate of about 80 sccm, and an argon heating gas was flowed against the bottom surface of the wafer at a flow rate of about 30 sccm. The power applied to the magnetron of the Endura sputtering system was about 750 watts DC. The aluminum was deposited in two steps. In the first step, aluminum was deposited for about 10 seconds while the substrate was at a temperature of about 200° C. In the second step, aluminum was deposited for about 3 minutes while the substrate was at a temperature of about 450° C.

FIG. 4A illustrates the formation of aluminum contacts near the center of a semiconductor wafer, while FIG. 4B illustrates the formation of aluminum contacts near the edge of a semiconductor wafer. Each of FIGS. 4A and 4B show the contact filling probability (i.e., the probability that a contact is filled with no voids) for each of five contact geometries at each of three process chamber temperatures during deposition of a titanium wetting layer. The leftmost group of bars in each of FIGS. 4A and 4B show the contact filling probability when the process chamber temperature during deposition of the titanium wetting layer was about 40° C., the center group of bars show the contact filling probability when the process chamber temperature during deposition of the titanium wetting layer was about 150° C., and the rightmost group of bars show the contact filling probability when the the process chamber temperature during deposition of the titanium wetting layer was about 450° C.

Within each group of bars, individual bars represent the contact filling probability for contacts formed in vias having various aspect ratios. Moving from left to right in each group, the aspect ratios are 1.60 (via diameter of 0.5, via depth of 0.8 micrometers), 1.33 (via diameter of 0.6, via depth of 0.8 micrometers), 1.14 (via diameter of 0.7, via depth of 0.8 micrometers), 1.00 (via diameter of 0.8, via depth of 0.8 micrometers) and 0.89 (via diameter of 0.9, via depth of 0.8 micrometers).

As can be seen, in accordance with the invention, the contact filling probability increased as the temperature of the process chamber (and thus the wafer) was increased during deposition of the titanium wetting layer. For all of the vias located near the edge of the wafer, and all but the highest aspect ratio vias located near the center of the wafer, depositing a wetting layer at a process chamber temperature of about 450° C. produced a contact filling probability of 100%.

As discussed above, forming a wetting layer at a relatively high process temperature produces a denser wetting layer having a smoother and more continuous surface on which to form the subsequent metallization layer. Thus, the metallization layer can be formed more smoothly on the wetting layer, improving the quality of the overall metal layer so formed. The improved wetting layer according to the invention thus enlarges the process window for the formation of the metallization layer. For example, when a two-step process described above for depositing aluminum is used, formation of a wetting layer according to the invention enables the process temperature during the second, hot deposition step to be reduced while still producing a metal layer of the same quality. Illustratively, when a process as taught by Geha in the above-referenced U.S. patent application Ser. No. 08/693,978 is used to deposit a metallization layer of aluminum, the substrate temperature during the second, hot deposition step can be reduced by about 50° C. This is particularly advantageous, since such reduction in substrate temperature reduces the likelihood that the substrate temperature will become high enough to cause damage to the substrate (e.g., previously deposited metal layers on the substrate). Alternatively, if the other aspects of the process of forming a metal layer are left unchanged, a wetting layer formed in accordance with the invention improves the quality of the overall metal layers formed using the wetting layer, as illustrated in FIGS. 4A and 4B, thus enabling more formation of more difficult metal layers (e.g., high aspect ratio vias). Consequently, it is possible to use aluminum deposition for situations in which it previously would have been necessary to use tungsten deposition. Since tungsten deposition, as described above, requires more process steps than aluminum deposition, the invention enables the elimination of process steps and, consequently, significant savings in cost and time in producing a metal layer in these situations.

As discussed above, collimated deposition and IMP deposition are two other processes for depositing a metal. Using a relatively high process temperature in accordance with the invention enables formation of a wetting layer using a standard deposition process that equals or approaches the quality of a wetting layer produced using collimated or IMP deposition. Thus, a high quality wetting layer can be produced without need to modify or replace existing deposition processes and equipment.

The invention can improve any process for forming a wetting layer. For example, increasing the process temperature in accordance with the invention during either collimated or IMP deposition improves the quality of the deposited wetting layer, thereby enabling formation of more problematic metal layers (e.g., filling of high aspect ratio vias) and/or enlargement of the process window for the formation of the wetting layer or subsequent formation of the metallization layer.

The steps of the method 200 described above are typically preceded and followed by a number of other steps. These other steps can be performed in processing chambers other than the processing chamber or chambers used to implement a method of the invention. For example, the following describes a process sequence that can encompass the steps of a method according to the invention. First, a conventional degassing procedure can be performed to remove moisture from a dielectric layer or layers on which a metal layer or layers are to be formed. Next, a conventional etching procedure (e.g., a conventional sputter etch procedure) can be performed to remove portions of the dielectric layer(s) to create vias or steps. Next, a method according to the invention is used to deposit a wetting layer and metallization layer in a desired location or locations. The metal deposition can be followed by further processing steps, such as the formation of a conventional antireflective coating (ARC) using conventional techniques. Finally, the substrate can be cooled according to a standard cooling procedure for a specified time (e.g., 30 seconds). It is to be understood that a method according to the invention is not confined to use with the process sequence described immediately preceding, and that a method according to the invention can be part of other process sequences that include some or all of the above-described steps, none of the above-described steps, and/or other steps not described above.

Figure 5:
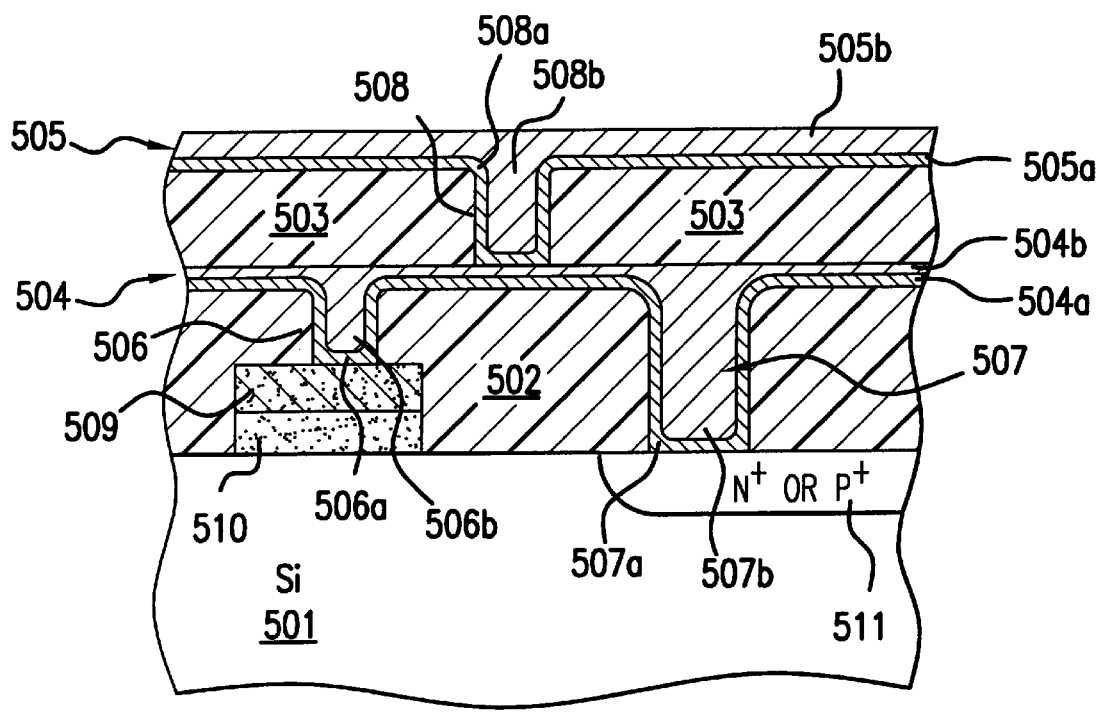
FIG. 5 is a cross-sectional view of a semiconductor substrate on which various layers of metal have been formed, illustrating several applications of a method according to the invention.

The invention as described above can be used, for example, to form various types of metallization on a semiconductor substrate (e.g., a semiconductor wafer). FIG. 5 is a cross-sectional view of a semiconductor substrate on which various layers of metal have been formed, illustrating several applications of a method according to the invention. Each of the metal layers or contacts shown in FIG. 5 includes a wetting layer and metallization layer, as described above. For example, a metal layer 504 (including a wetting layer 504a and a metallization layer 504b) formed on the dielectric layer 502 may be electrically connected to a polysilicon gate 509 formed on oxide 510 by a metal contact 506 (including a wetting layer 506a and a metallization layer 506b) that extends through a dielectric layer 502. Similarly, metal layer 504 may be electrically connected to an electrically doped region 511 of the silicon substrate 501 by a metal contact 507 (including a wetting layer 507a and a metallization layer 507b) that extends through a dielectric layer 502. A second metal layer 505 (including a wetting layer 505a and a metallization layer 505b) formed on the dielectric layer 503 that overlies the first metal layer 504 may be electrically connected to the first metal layer 504 by a metal contact 508 (including a wetting layer 508a and a metallization layer 508b) that extends through the dielectric layer 503. When aluminum is used for the metallization layer 504b of the layer 504, then it may be necessary to form a barrier layer (e.g., a titanium-tungsten alloy or titanium nitride) on top of the metallization layer 504b to prevent or inhibit migration of silicon atoms into the aluminum.

The invention is broadly applicable to the formation of a metal layer on any type of substrate or device. For example, formation of a metal layer according to the invention can be accomplished on any type of semiconductor substrate, such as a semiconductor wafer. Illustratively, the invention can be used to form metal layers in active electronic components (e.g., integrated circuit chips, transistors and diodes) and passive electronic components (e.g., resistors, capacitors and inductors). The invention can also be used to form metal layers in other types of devices, such as lead frames, medical devices, disks and heads and flat panel displays.

Various embodiments of the invention have been described. The descriptions are intended to be illustrative, not limitative. Thus, it will be apparent to one skilled in the art that certain modifications may be made to the invention as described above without departing from the scope of the claims set out below.

We claim:

1. A method of forming a layer of metal on a substrate while the substrate is in a process chamber, comprising the steps of:
    forming a wetting layer on a first substrate surface at a first process chamber temperature of greater than or equal to about 275° C.,
    forming a first portion of a metallization layer on the wetting layer at a second process chamber temperature of less than or equal to about 250° C., and
    forming a second portion of the metallization layer at a substrate temperature greater than or equal to 380° C.

2. A method as in claim 1, wherein the wetting layer comprises titanium.

3. A method as in claim 2, wherein the metallization layer comprises aluminum.

4. A method as in claim 1, wherein the wetting layer comprises titanium.

5. A method as in claim 1, wherein the wetting layer consists essentially of one or more metals.

6. A method as in claim 2, wherein the wetting layer consists essentially of titanium.

7. A method of forming a layer of metal on a substrate while the substrate is in a process chamber, comprising the steps of:
    forming a wetting layer on a first substrate surface at a first process chamber temperature which is greater than a predetermined temperature,
    forming at least a portion of a metallization layer on the wetting layer while at a second process chamber temperature less than the first process chamber temperature and forming a remainder of the metallization layer at a third process chamber temperature greater than the second process chamber temperature.

8. A method as in claim 7, wherein the first process chamber temperature is greater than or equal to about 275° C.

9. A method as in claim 8, wherein the second process chamber temperature is less than or equal to about 275° C.

10. A method as in claim 7, wherein the third process chamber temperature is greater than or equal to about 450° C.

11. A method as in claim 7, further comprising the step of cooling the process chamber to a fourth temperature that is less than the first process chamber temperature during the step of forming the wetting layer, wherein the step of forming a metallization layer on the wetting layer occurs during and/or after the step of cooling.

12. A method as in claim 11, further comprising, after the step of cooling, the step of heating the process chamber so that the temperature of the process chamber increases, wherein the step of forming a metallization layer on the wetting layer further comprises the step of forming the remainder of the metallization layer during and/or after the step of heating.

13. A method as in claim 7, wherein the first process chamber temperature is greater than or equal to about 250° C.

14. A method as in claim 7, wherein the first process chamber temperature is about 400° C.

15. A method as in claim 14, where the second process chamber temperature is less than or equal to about 250° C.

16. A method as in claim 7, wherein the step of forming a wetting layer is performed while the process chamber temperature is greater than or equal to about 275° C.

17. A method as in claim 16, wherein the step of forming a wetting layer is performed while the process chamber temperature is greater than or equal to about 400° C.

18. A method as in claim 17, wherein the step of forming a wetting layer is performed while the process chamber temperature is greater than or equal to about 450° C.

19. A method as in claim 7, wherein the wetting layer consists essentially of one or more metals.

20. A method as in claim 16, wherein the wetting layer consists essentially of one or more metals.

21. A method as in claim 4, wherein the wetting layer consists essentially of titanium.

* * * * *